United States Patent
Matsubara et al.

(10) Patent No.: US 9,608,640 B1
(45) Date of Patent: Mar. 28, 2017

(54) RECEIVING CIRCUIT AND METHOD FOR CONTROLLING FREQUENCY

(71) Applicant: FUJITSU LIMITED, Kawasaki-shi, Kanagawa (JP)

(72) Inventors: Satoshi Matsubara, Machida (JP); Hisakatsu Yamaguchi, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/255,177

(22) Filed: Sep. 2, 2016

(30) Foreign Application Priority Data

Oct. 20, 2015 (JP) ................................ 2015-206654

(51) Int. Cl.
*H04L 7/00* (2006.01)
*H03L 7/08* (2006.01)
*H03K 5/1534* (2006.01)
*H03L 7/087* (2006.01)

(52) U.S. Cl.
CPC ......... *H03L 7/0807* (2013.01); *H03K 5/1534* (2013.01); *H03L 7/087* (2013.01)

(58) Field of Classification Search
USPC .................................................. 375/354, 355
See application file for complete search history.

(56) References Cited

U.S. PATENT DOCUMENTS

| 7,403,073 | B2 * | 7/2008 | Kossel ..................... H03L 7/089 327/156 |
| 8,692,597 | B1 * | 4/2014 | Hiebert .................... H03L 7/081 327/148 |
| 2004/0218705 | A1 * | 11/2004 | Cranford, Jr. ............. H03L 7/07 375/355 |
| 2005/0093591 | A1 * | 5/2005 | Rhee ...................... H03L 7/0814 327/156 |
| 2007/0047689 | A1 * | 3/2007 | Menolfi ................. H03D 3/006 375/376 |
| 2013/0162309 | A1 | 6/2013 | Tamura |
| 2015/0222418 | A1 * | 8/2015 | Akita ...................... H03L 7/087 375/355 |
| 2015/0311908 | A1 * | 10/2015 | Laaja ...................... H03L 7/093 327/159 |
| 2016/0013929 | A1 * | 1/2016 | Takanashi ................ H03L 7/07 375/375 |
| 2016/0211964 | A1 * | 7/2016 | Chang ..................... H04L 25/49 |

FOREIGN PATENT DOCUMENTS

| JP | 11-331135 | 11/1999 |
| JP | 2013-135423 | 7/2013 |

* cited by examiner

*Primary Examiner* — Adam Houston
(74) *Attorney, Agent, or Firm* — Fujitsu Patent Center

(57) ABSTRACT

A receiving circuit includes: a detector configured to detect a position at which logics of first data and second data acquired by sampling received data using two clocks having mutually-different phases do not match each other as an edge; and an adjustment circuit configured to perform an adjustment causing an internal clock frequency to be close to a data frequency in the received data based on a first probability that logics of third data in a next cycle of the first data and the second data match each other and a second probability that logics of fourth data in a next cycle of the second data and the third data match each other.

12 Claims, 8 Drawing Sheets

FIG. 2

|  | $F_{clk} < F_{data}$ | $F_{clk} \sim F_{data}$ | $F_{clk} > F_{data}$ |
|---|---|---|---|
| PROBABILITY OF $D_{B0} = D_{A1}$ | 50% | 100% | 100% |
| PROBABILITY OF $D_{A1} = D_{B1}$ | ~100% | 50% | 100% |

| $D_{B0} = D_{A1}$ | $D_{A1} = D_{B1}$ | OUTPUT |
|---|---|---|
| $\geqq 90\%$ | $\geqq 90\%$ | DN |
| $\geqq 90\%$ | $< 90\%$ | NONE |
| $< 90\%$ | – | UP |

RECEIVING CIRCUIT AND METHOD FOR CONTROLLING FREQUENCY

CROSS-REFERENCE TO RELATED APPLICATION

This application is based upon and claims the benefit of priority of the prior Japanese Patent Application No. 2015-206654, filed on Oct. 20, 2015, the entire contents of which are incorporated herein by references.

FIELD

The embodiments discussed herein are related to a receiving circuit and a method for controlling a frequency.

BACKGROUND

A clock and data recovery (CDR) circuit extracting a clock from received data and restoring the received data has been used in a receiving circuit. The CDR circuit is largely divided into two types, i.e., a type using a reference clock and a type that does not use a reference clock (reference clockless CDR circuit). The type using a reference clock generates a frequency according to a data rate by using a phase locked loop (PLL) circuit. For this reason, the CDR circuit of the type that uses a reference clock does not have a frequency adjusting function. The reference clockless (the type that does not use a reference clock) CDR circuit generates a clock signal of a frequency according to a data rate by using the CDR circuit. For this reason, the CDR circuit of the type that does not use a reference clock has a frequency adjusting function.

Related techniques are disclosed in, for example, Japanese Laid-Open Patent Publication No. 2013-135423 and Japanese Laid-Open Patent Publication No. 11-331135.

SUMMARY

According one aspect of the embodiments, a receiving circuit includes: a detector configured to detect a position at which logics of first data and second data acquired by sampling received data using two clocks having mutually-different phases do not match each other as an edge; and an adjustment circuit configured to perform an adjustment causing an internal clock frequency to be close to a data frequency in the received data based on a first probability that logics of third data in a next cycle of the first data and the second data match each other and a second probability that logics of fourth data in a next cycle of the second data and the third data match each other.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF DRAWINGS

FIG. 2 is a diagram illustrating an example of a truth value table used in the FD control;

FIG. 6 is a diagram illustrating an example of a truth value table used by a probability calculating circuit;

DESCRIPTION OF EMBODIMENTS

When there is a difference between the frequency of an internal clock and the frequency of data, a data edge (transition point) is shifted. In order to determine the direction of this shift, sampling information of three or more points per unit interval (UI) is necessary.

A receiving circuit corrects data with high precision using two pieces of input data. Such a receiving circuit selects and then corrects two pieces of input data having a center phase of input data of a binary level for one UI interposed therebetween and detects a phase in which the level of the input data transits as a boundary phase of one UI based on the corrected input data. The level of any data out of two pieces of the corrected input data is determined based on the detected boundary phase and corrected based on a correction value according to the level of the data in the past.

A received signal is sampled using a high-speed clock signal having a cycle faster than the bit rate, and a code change point is detected from the sampling signal. The bit rate of the received signal is recognized based on this code change point and the received signal is extracted based on the bit rat.

In a 4× oversampling technology, sampling data is performed using a clock of four phases for one UI. When an oversampling is performed, the number of comparators is increased according to the number of phases to be acquired, and the circuit scales of a clock buffer, a demultiplexer, and the like are also increased. When the circuit scales are increased, the power consumption also increases.

An aspect of the present disclosure is to decrease the circuit scale and reduce the power consumption.

An embodiment of the present disclosure implements a 2× oversampling CDR capable of determining a shift direction. In the 2× oversampling CDR, compared to the 4× oversampling, the number of comparators may be decreased, and the circuit scales of a clock buffer, a demultiplexer, and the like may be decreased. Accordingly, the power consumption may also be decreased.

According to the 2× oversampling CDR of an embodiment of the present disclosure, received data is sampled with a slightly shifted phase (e.g., shifted by minimum resolution of a phase rotator), and a logical relationship between the data of two points is checked, whereby a frequency comparison may be realized. In the 2× oversampling CDR, by acquiring a magnitude relationship between a data frequency and an internal clock frequency, a shift direction is determined, and a frequency detector (FD) control for adjusting the internal clock frequency is performed.

Figure 1:
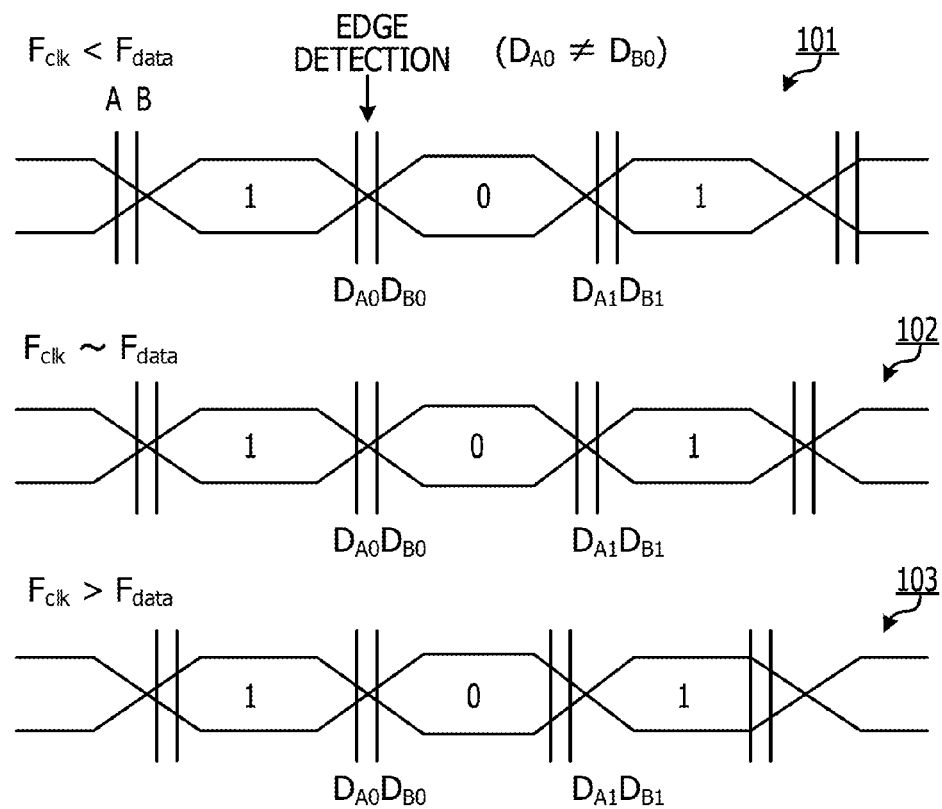
FIG. 1 is a diagram illustrating an exemplary frequency detector (FD) control according to this embodiment.

FIG. 1 is a diagram illustrating an exemplary FD control according to this embodiment. A frequency detector (FD) included in a 2× oversampling CDR circuit adjusts an error between the frequency of received data and the internal clock frequency up to about 1% by performing the FD control. Cases 101 to 103 illustrate examples where a receiving circuit receives data in an order of "1," "0," and "1."

When a data frequency $F_{data}$ is higher than the internal clock frequency $F_{clk}$ (in the case of Case 101), the frequency detector (FD) performs an adjustment to increase the internal clock frequency $F_{clk}$. For example, the FD transmits an instruction for increasing the internal clock frequency to a voltage controlled oscillator (VCO). The VCO increases the internal clock frequency in accordance with the instruction.

When an error between the data frequency $F_{data}$ and the internal clock frequency $F_{clk}$ is small (in the case of Case 102), the frequency detector (FD) ends the frequency adjustment (FD control) by the FD. The FD determines that the error between the data frequency $F_{data}$ and the internal clock frequency $F_{clk}$ converges within a specific range (e.g., within 1%).

When a data frequency $F_{data}$ is lower than the internal clock frequency $F_{clk}$ (in the case of Case 103), the frequency detector (FD) performs an adjustment to decrease the internal clock frequency $F_{clk}$. For example, the FD transmits an instruction for decreasing the internal clock frequency to the VCO. The VCO decreases the internal clock frequency in accordance with the instruction.

In this way, the internal clock frequency $F_{clk}$ is adjusted to be close to the data frequency $F_{data}$. For the adjustment, a magnitude relationship between the data frequency $F_{data}$ and the internal clock frequency $F_{clk}$ may be required to be determined. Determination methods of Case 101 to Case 103 will be described below.

(1) A phase rotator fixedly sets a phase difference between a lead phase A and a lag phase B.

(2) The FD detects a position at which the phases A and B do not match each other, as a data edge (transition point). In Case 101 to Case 103, an interval between data $D_{A0}$ and data $D_{B0}$ at which data transits from 1 to 0 is detected as an edge.

(3) The FD determines a logical match between data $D_{B0}$ and data $D_{A1}$ that is data of a next cycle from a cycle in which an edge is detected. In addition, the FD determines a logical match between data $D_{A1}$ and data $D_{B1}$ that are data of a next cycle form a cycle in which an edge is detected.

(4) The FD adjusts the internal clock frequency based on results of the logical match between the data $D_{B0}$ and the data $D_{A1}$ and the logical match between the data $D_{A1}$ and the data $D_{B1}$.

When data is received in an order of "1," "0," and "1" in a state in which the data frequency $F_{data}$ is higher than the internal clock frequency $F_{clk}$ (Case 101), the data $D_{B0}$ is 0, and the data $D_{A1}$ is 1, and accordingly, the logics do not match each other. Meanwhile, when data is received in an order of "1," "0," and "0," in the state in which the data frequency $F_{data}$ is higher than the internal clock frequency $F_{clk}$, the data $D_{B0}$ is 0, and the data $D_{A1}$ is 0, and accordingly, the logics match each other. Since received data is assumed to be random, when the data frequency $F_{data}$ is higher than the internal clock frequency $F_{clk}$, a probability that the logics of the data $D_{B0}$ and the data $D_{A1}$ match each other is 50%.

When data is received in an order of "1," "0," and "1" in a state in which the data frequency $F_{data}$ is higher than the internal clock frequency $F_{clk}$ (Case 101), the data $D_{A1}$ is 1, and the data $D_{B1}$ is 1, and accordingly, the logics match each other. In addition, when data is received in an order of "1," "0," and "0" in the state in which the data frequency $F_{data}$ is higher than the internal clock frequency $F_{clk}$, the data $D_{A1}$ is 0, and the data $D_{B1}$ is 0, and accordingly, the logics match each other. Accordingly, when the data frequency $F_{data}$ is higher than the internal clock frequency $F_{clk}$, a probability that the logics of the data $D_{A1}$ and the data $D_{B1}$ match each other is 100%, regardless of received data.

When data is received in an order of "1," "0," and "1" in a state in which an error between the data frequency $F_{data}$ and the internal clock frequency $F_{clk}$ is small (Case 102), the data $D_{B0}$ is 0, and the data $D_{A1}$ is 0, and accordingly, the logics match each other. In addition, when data is received in an order of "1," "0," and "0" in a state in which an error between the data frequency $F_{data}$ and the internal clock frequency $F_{clk}$ is small, the data $D_{B0}$ is 0, and the data $D_{A1}$ is 0, and accordingly, the logics match each other. Accordingly, when the error between the data frequency $F_{data}$ and the internal clock frequency $F_{clk}$ is small, a probability that the logics of the data $D_{B0}$ and the data $D_{A1}$ match each other is 100%.

When data is received in an order of "1," "0," and "1" in a state in which an error between the data frequency $F_{data}$ and the internal clock frequency $F_{clk}$ is small (Case 102), the data $D_{A1}$ is 0, and the data $D_{B1}$ is 1, and accordingly, the logics do not match each other. Meanwhile, when data is received in an order of "1," "0," and "0" in a state in which an error between the data frequency $F_{data}$ and the internal clock frequency $F_{clk}$ is small, the data $D_{A1}$ is 0, and the data $D_{B1}$ is 0, and accordingly, the logics match each other. When the error between the data frequency $F_{data}$ and the internal clock frequency $F_{clk}$ is small, received data is assumed to be random, and accordingly, a probability that the logics of the data $D_{A1}$ and the data $D_{B1}$ match each other is 50%.

When data is received in an order of "1," "0," and "1" in a state in which the data frequency $F_{data}$ is lower than the internal clock frequency $F_{clk}$ (Case 103), the data $D_{B0}$ is 0, and the data $D_{A1}$ is 0, and accordingly, the logics match each other. In addition, when data is received in an order of "1," "0," and "0" in a state in which the data frequency $F_{data}$ is lower than the internal clock frequency $F_{clk}$, the data $D_{B0}$ is 0, and the data $D_{A1}$ is 0, and accordingly, the logics match each other. Accordingly, when the data frequency $F_{data}$ is lower than the internal clock frequency $F_{clk}$, a probability that the logics of the data $D_{B0}$ and the data $D_{A1}$ match each other is 100%.

When data is received in an order of "1," "0," and "1" in a state in which the data frequency $F_{data}$ is lower than the internal clock frequency $F_{clk}$ (Case 103), the data $D_{A1}$ is 0, and the data $D_{B1}$ is 0, and accordingly, the logics match each other. In addition, when data is received in an order of "1," "0," and "0" in a state in which the data frequency $F_{data}$ is lower than the internal clock frequency $F_{clk}$, the data $D_{A1}$ is 0, and the data $D_{B1}$ is 0, and accordingly, the logics match each other. Accordingly, when the data frequency $F_{data}$ is lower than the internal clock frequency $F_{clk}$, a probability that the logics of the data $D_{A1}$ and the data $D_{B1}$ match each other is 100%.

For example, by performing the processes of (1) to (3) plural times, the FD may calculate probabilities of the logical match between the data $D_{B0}$ and the data $D_{A1}$ and the logical match between the data $D_{A1}$ and the data $D_{B1}$, and the FD may determine one of the states of Case 101 to Case 103 as the state of the received data. In the case of Case 101 and Case 103, by transmitting an instruction for adjusting the internal clock frequency to be close to the data frequency to the VCO, the FD may decrease the error between the data frequency $F_{data}$ and the internal clock frequency $F_{clk}$.

When the control process using the FD ends, the process proceeds to a phase detector, and a fine adjustment of the frequency and the phase is performed.

In this way, by measuring two points of the phases A and B, the adjustment of the internal clock frequency through the 2× oversampling CDR may be performed. By implementing the 2× oversampling CDR, compared to 4× oversampling, the number of comparators may be decreased, and the circuit scales of a clock buffer, a demultiplexer, and the like may be decreased. As a result, the amount of power consumption may also be reduced.

FIG. 2 is a diagram illustrating an example of a truth value table used in the FD control. The truth value table 200 is a table in which a relationship between the data frequency $F_{data}$ and the internal clock frequency $F_{clk}$ and the probability of a logical match between the data $D_{B0}$ and the data $D_{A1}$ and the probability of a logical match between the data $D_{A1}$ and the data $D_{B1}$ are associated with each other.

The FD, for example, for 100 pieces of data, performs the processes of (1) to (3) and calculates the probability of the logical match between the data $D_{B0}$ and the data $D_{A1}$ and the probability of the logical match between the data $D_{A1}$ and the data $D_{B1}$. The FD sets the the probability of the match to 50% when the probability of the logical match is within 50 times±10% and sets the probability of the match to 100% when the probability of the logical match is 90 times or more.

Here, when the data frequency $F_{data}$ included in the truth value table 200 is remarkably higher than the internal clock frequency $F_{clk}$ and when the data $D_{A1}$ and the data $D_{B1}$ are applied in a cycle after two cycles from a cycle in which an edge is detected, the probability of the logical match between the data $D_{A1}$ and the data $D_{B1}$ may be 50%. For this reason, in the truth value table 200, the probability of a logical match between the data $D_{A1}$ and the data $D_{B1}$ when the data frequency $F_{data}$ is higher than the internal clock frequency $F_{clk}$ is a match probability of being "equal to or less than 100%."

When the probability of the logical match between the data $D_{B0}$ and the data $D_{A1}$ is 50%, and the probability of the logical match between the data $D_{A1}$ and $D_{B1}$ is 100%, the FD determines that the data frequency $F_{data}$ is higher than the internal clock frequency $F_{clk}$.

When the probability of the logical match between the data $D_{B0}$ and the data $D_{A1}$ is 100%, and the probability of the logical match between the data $D_{A1}$ and $D_{B1}$ is 50%, the FD determines that an error between the data frequency $F_{data}$ and the internal clock frequency $F_{clk}$ is small.

When the probability of the logical match between the data $D_{B0}$ and the data $D_{A1}$ is 100%, and the probability of the logical match between the data $D_{A1}$ and the data $D_{B1}$ is 100%, the FD determines that the data frequency $F_{data}$ is lower than the internal clock frequency $F_{clk}$.

The FD, according to the determination, transmits an instruction to increase/decrease the internal clock frequency to the VCO.

Figure 3:
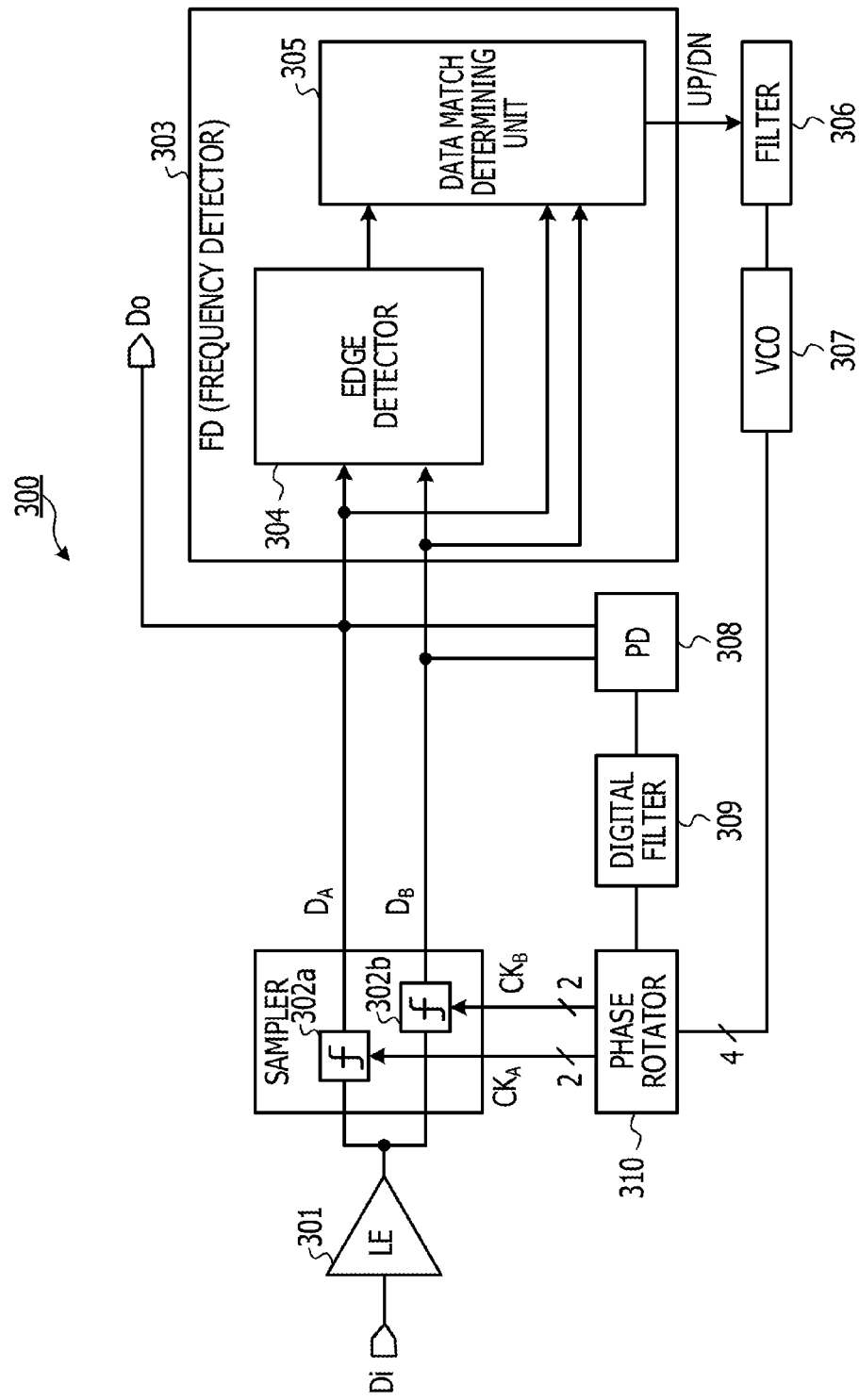
FIG. 3 is a diagram illustrating an example of a 2× oversampling CDR circuit according to this embodiment.

FIG. 3 is a diagram illustrating an example of the 2× oversampling CDR circuit according to this embodiment. A receiving circuit 300 is an example of the 2× oversampling CDR circuit. The receiving circuit 300 includes a linear equalizer (LE) 301, a sampler 302, an FD 303, a filter 306, a VCO 307, a PD 308, a digital filter 309, and a phase rotator 310.

The LE 301 is a circuit that restores a high-frequency component of an input data signal that has been lost in a transmission line by decreasing a gain for a low-frequency component and equivalently intensifying the high-frequency component. The sampler 302 determines the logics of the input data signal of which the high-frequency component has been restored by the LE at timings of clocks CKA and CKB and converts the restored input data signals into digital values (0/1).

The FD 303 performs an edge detection from data $D_{A0}$ and data $D_{B0}$, determines a shift direction by acquiring a magnitude relationship between the data frequency and the internal clock frequency by using data $D_{A1}$ and $D_{B1}$ of a next cycle from a cycle in which the edge detection is performed, and performs an adjustment of the internal clock frequency. For example, the FD 303 causes an error between the data frequency and the internal clock frequency to be close up to about 1%. The PD 308 performs an adjustment of eliminating the error between the data frequency and the internal clock frequency and causing the phases to match each other.

As for the filter 306, a low pass filter is used as a feedback loop filter. In a circuit including feedback, unnecessary oscillation may occur in accordance with amplification of signal variations of short periods, and the filter 306 excludes the variations of short periods. The VCO 307 is a circuit that controls an output frequency using an input voltage. The VCO 307 operates as an adjustment unit adjusting the internal clock frequency in accordance with an instruction received from the FD 303. The digital filter 309 may be a low pass filter as well.

The FD 303 according to this embodiment includes an edge detector 304 and a data match determining unit 305. The edge detector 304 detects a position (between the data $D_{A0}$ and the data $D_{B0}$) at which logics of data do not match each other at the phases A and B transmitted from the sampler 302 as an edge. When an edge is detected, the edge detector 304 notifies the data match determining unit 305 of the detection of the edge.

When the detection of the edge is notified from the edge detector 304, the data match determining unit 305 determines a logic match between the data $D_{B0}$ and the data $D_{A1}$ that is the data of a next cycle form a cycle in which an edge is detected. In addition, the data match determining unit 305 determines a logic match between the data $D_{A1}$ and the data $D_{B1}$ that are data of a next cycle form a cycle in which an edge is detected. The data match determining unit 305 transmits an instruction to adjust the internal clock frequency based on the results of the logic match between the data $D_{B0}$ and the data $D_{A1}$ and the logic match between the data $D_{A1}$ and $D_{B1}$. The VCO 307 controls the internal clock frequency in accordance with an instruction transmitted from the data match determining unit 305.

In this way, by measuring two points of the phases A and B, the internal clock frequency may be adjusted using the 2× oversampling CDR. By implementing the 2× oversampling CDR, compared to 4× oversampling, the number of comparators may be decreased, and the circuit scales of the clock buffer and the like may be decreased. Accordingly, the amount of power consumption may also be reduced.

Figure 4:
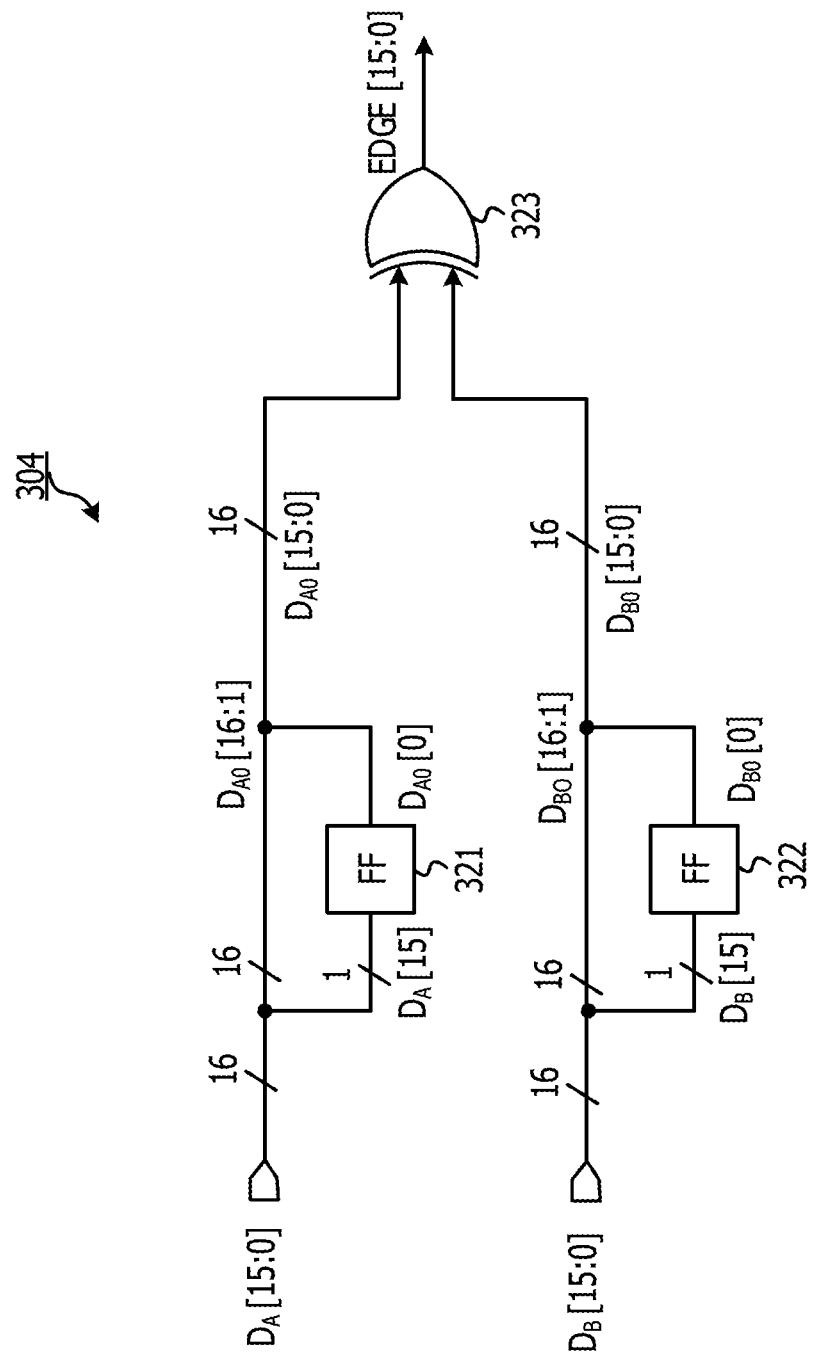
FIG. 4 is a diagram illustrating an exemplary circuit configuration of an edge detector.

FIG. 4 is a diagram illustrating an example of the circuit configuration of the edge detector. The edge detector 304 includes an XOR 323 that takes exclusive logical OR between data $D_A$ of a phase A acquired by a sampler 302a and data $D_B$ of a phase B acquired by a sampler 302b. By taking the exclusive logical OR using the XOR 323, a match between the data $D_A$ of the phase A and the data $D_B$ of the phase B may be determined.

For example, the XOR 323 compares the input data $D_A$ and $D_B$ of 16 bits with each other in the units of bits. The XOR 323 determines the bits of $D_A[N]$ and $D_B[N]$ (here, N=0 to 15) of which logics do not match each other. The XOR 323 outputs EDGE=1 that is a signal representing that a corresponding bit is an edge when no match is determined, and outputs EDGE=0 when no edge is found.

Figure 5:
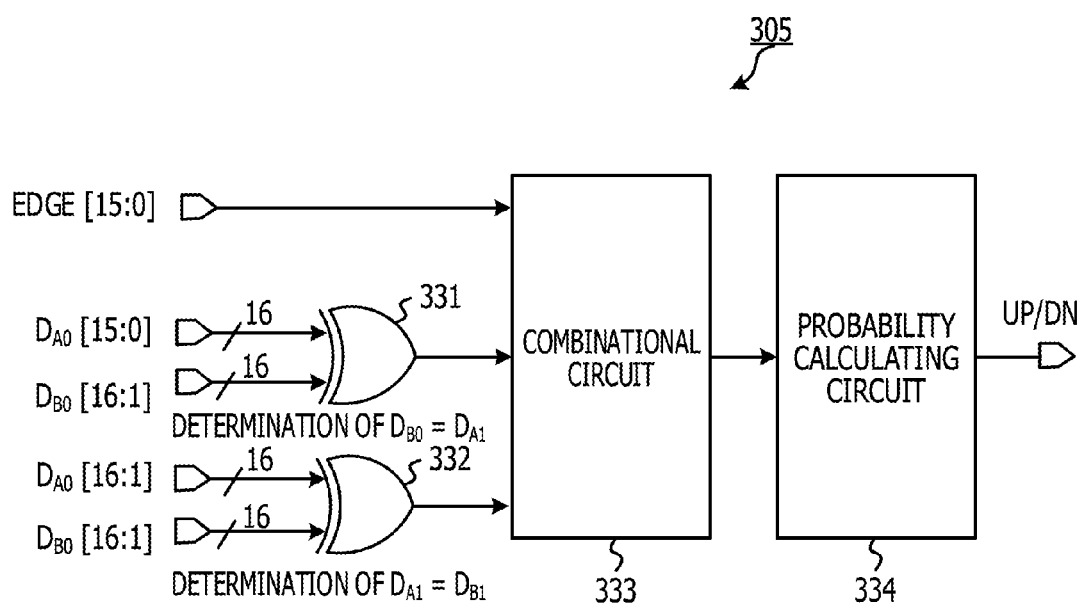
FIG. 5 is a diagram illustrating an exemplary circuit configuration of a data match determining unit.

FIG. 5 is a diagram illustrating an exemplary circuit configuration of the data match determining unit. The data match determining unit 305 includes an XNOR 331, an XNOR 332, a combinational circuit 333, and a probability calculating circuit 334.

The XNOR 331 determines a match between data $D_{B0}$ and data $D_{A1}$. For example, the XNOR 331 takes logical exclusive NOR of data $D_{B(0+N)}$ and data $D_{A(1+N)}$. When the values of the data $D_{B(0+N)}$ and the data $D_{A(1+N)}$ match each other, the XNOR 331 outputs "1" representing that the logics match each other. The XNOR 332 determines a match between data $D_{A1}$ and data $D_{B1}$. For example, the XNOR 332 takes logical exclusive NOR of data $D_{A(1+N)}$ and data $D_{B(1+N)}$. When the values of the data $D_{A(1+N)}$ and the data $D_{B(1+N)}$ match each other, the XNOR 332 outputs "1" representing that the logics match each other.

The combinational circuit 333 receives a processing result of the XNOR 331, a processing result of eth XNOR 332, and the value of an edge transmitted from the edge detector 304. When EDGE=1 is received (when an edge is detected by the edge detector), the combinational circuit 333 handles the processing results received from the XOR 331 and the XOR 332 to be valid. The combinational circuit 333 may acquire a result of the logical match between the data $D_{B0}$ and the data $D_{A1}$ and a result of the logical match between the data $D_{A1}$ and the data $D_{B1}$ for a bit at which an edge has been detected by the edge detector.

The probability calculating circuit 334 receives the result of the logical match between the data $D_{B0}$ and the data $D_{A1}$ and the result of the logical match between the data $D_{A1}$ and the data $D_{B1}$ for the bit at which an edge has been detected by the edge detector from the combinational circuit 304. The probability calculating circuit 334 includes a memory and stores, in the memory, the result of the logical match between the data $D_{B0}$ and the data $D_{A1}$ and the result of the logical match between the data $D_{A1}$ and the data $D_{B1}$ which are transmitted from the combinational circuit 333 for a case where an edge is detected. The probability calculating circuit 332 calculates "a probability of a logical match between the data $D_{B0}$ and the data $D_{A1}$" and "a probability of a logical match between the data $D_{A1}$ and the data $D_{B1}$" based on the result of the logical match between the data $D_{B0}$ and the data $D_{A1}$ and the result of the logical match between the data $D_{A1}$ and the data $D_{B1}$ that are stored.

The probability calculating circuit 334 outputs an instruction to increase or decrease the internal clock frequency based on "the probability of a logical match between the data $D_{B0}$ and the data $D_{A1}$" and "the probability of a logical match between the data $D_{A1}$ and the data $D_{B1}$" that are calculated. The probability calculating circuit 334 determines whether or not to increase or decrease the internal clock frequency, based on a truth value table 400 to be described later with reference to FIG. 6.

FIG. 6 is a diagram illustrating an example of the truth value table used by the probability calculating circuit. The probability calculating circuit 334 outputs an instruction to increase or decrease the internal clock frequency based on "the probability of a logical match between the data $D_{B0}$ and the data $D_{A1}$," "the probability of a logical match between the data $D_{A1}$ and the data $D_{B1}$" that are calculated, and the truth value table 400.

The probability calculating circuit 334 outputs an instruction to decrease the internal clock frequency when "the probability of a logical match between the data $D_{B0}$ and the data $D_{A1}$" is 90% or more, and "the probability of a logical match between the data $D_{A1}$ and the data $D_{B1}$" is 90% or more based on the truth value table 400. For this reason, when "the probability of a logical match between the data $D_{B0}$ and the data $D_{A1}$" is 90% or more, and "the probability of a logical match between the data $D_{A1}$ and the data $D_{B1}$" is 90% or more, the VCO 307 decreases the internal clock frequency.

The probability calculating circuit 334 does not adjust the internal clock frequency when "the probability of a logical match between the data $D_{B0}$ and the data $D_{A1}$" is 90% or more, and "the probability of a logical match between the data $D_{A1}$ and the data $D_{B1}$" is less than 90% based on the truth value table 400.

The probability calculating circuit 334 outputs an instruction to increase the internal clock frequency when "the probability of a logical match between the data $D_{B0}$ and the data $D_{A1}$" is less than 90% based on the truth value table 400. For this reason, when "the probability of a logical match between the data $D_{B0}$ and the data $D_{A1}$" is less than 90%, the VCO 307 increases the internal clock frequency.

Figure 7:
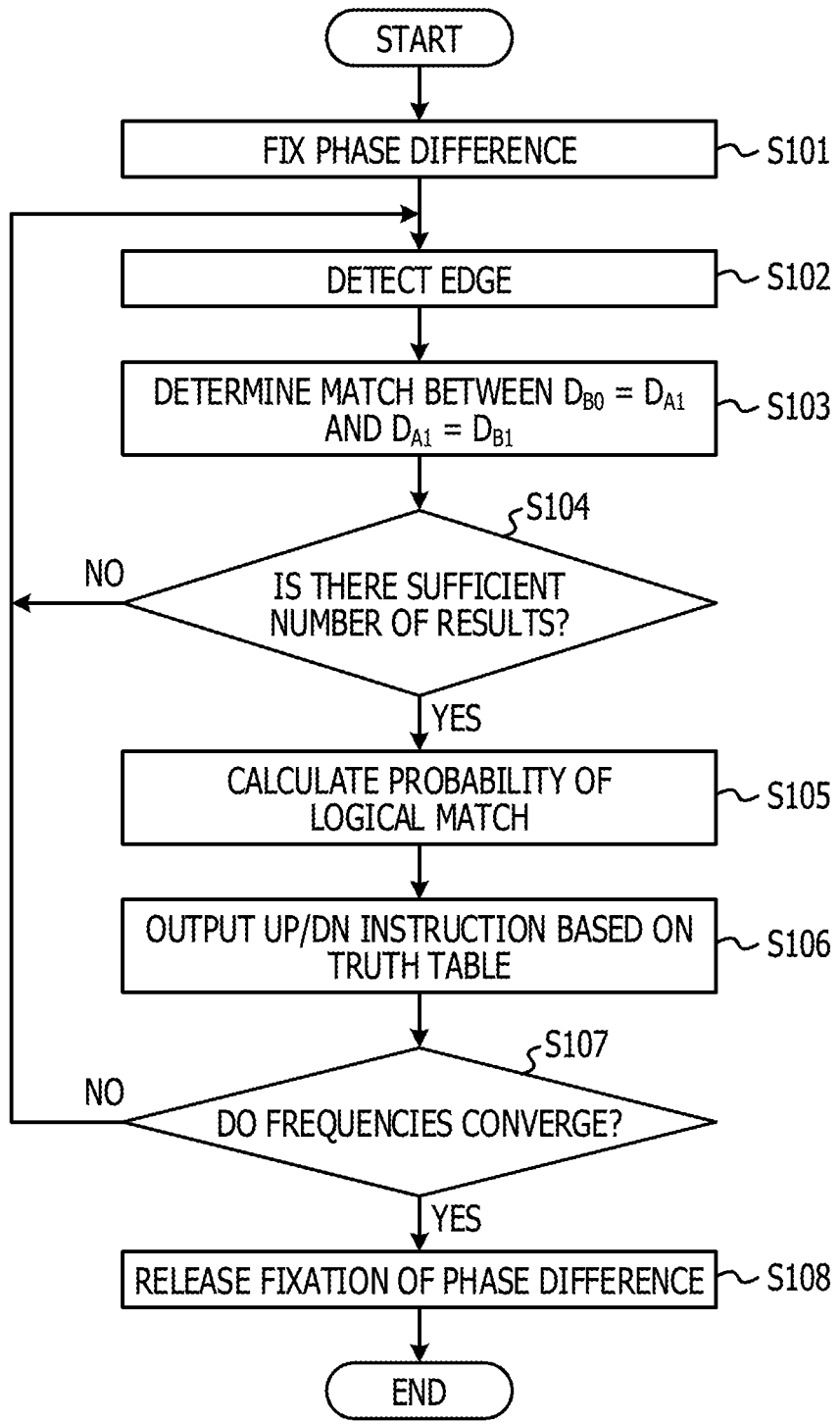
FIG. 7 is a flowchart illustrating an example of the process of the FD according to this embodiment.

FIG. 7 is a flowchart illustrating an exemplary process of the FD control according to this embodiment. When data is received, the receiving circuit 300 starts a FD control process. The phase rotator 310 fixedly sets a phase difference between phases A and B (Operation S101). The edge detector 304 detects a position at which data values of the phases A and B do not match each other as a data edge (transition point) (Operation S102). The data match determining unit 305 determines a logical match between data $D_{B0}$ and data $D_{A1}$ and a logical match between the data $D_{A1}$ and $D_{B1}$ (Operation S103).

The data match determining unit 305 determines whether results of the logical match between the data $D_{B0}$ and the data $D_{A1}$ and the logical match between the data $D_{A1}$ and $D_{B1}$ corresponding to a sufficient number (for example, 100) for calculating probabilities are stored in the memory (Operation S104). When it is determined that results corresponding to the sufficient number are not stored in the memory (No in Operation S104), the FD repeats the process from Operation S102. When it is determined that results corresponding to the sufficient number are stored in the memory (Yes in Operation S104), the data match determining unit 305 calculates a probability that the logics of the data $D_{B0}$ and the data $D_{A1}$ match each other and a probability that the logics of the data $D_{A1}$ and the data $D_{B1}$ match each other (Operation S105). The data match determining unit 305 outputs an instruction to increase or decrease the internal clock frequency based on the probability that the logics of the data $D_{B0}$ and the data $D_{A1}$ match each other, the probability that the logics of the data $D_{A1}$ and the data $D_{B1}$ match each other, and the truth value table 400 (Operation S106). The data match determining unit 305 determines whether or not an error between the internal clock frequency and the data frequency is sufficiently small (converges) (Operation S107).

When it is determined that the error between the internal clock frequency and the data frequency is not small (No in Operation S107), the FD repeats the process from Operation S102. When it is determined that the error between the internal clock frequency and the data frequency is sufficiently small (Yes in Operation S107), the fixation of the phase difference set in the phase rotator 310 is released (Operation S108). When the process of Operation S108 ends, the control process using the FD ends.

When the control process using the FD ends, the process proceeds to the PD, and a fine adjustment of the phase and the like is performed.

In this way, by measuring two points of the phases A and B, the internal clock frequency may be adjusted through the 2× oversampling CDR. By implementing the 2× oversampling CDR, compared to 4× oversampling, the number of comparators may be decreased, and the circuit scales of a clock buffer, a demultiplexer, and the like may be decreased. As a result, the amount of power consumption may also be reduced.

Figure 8:
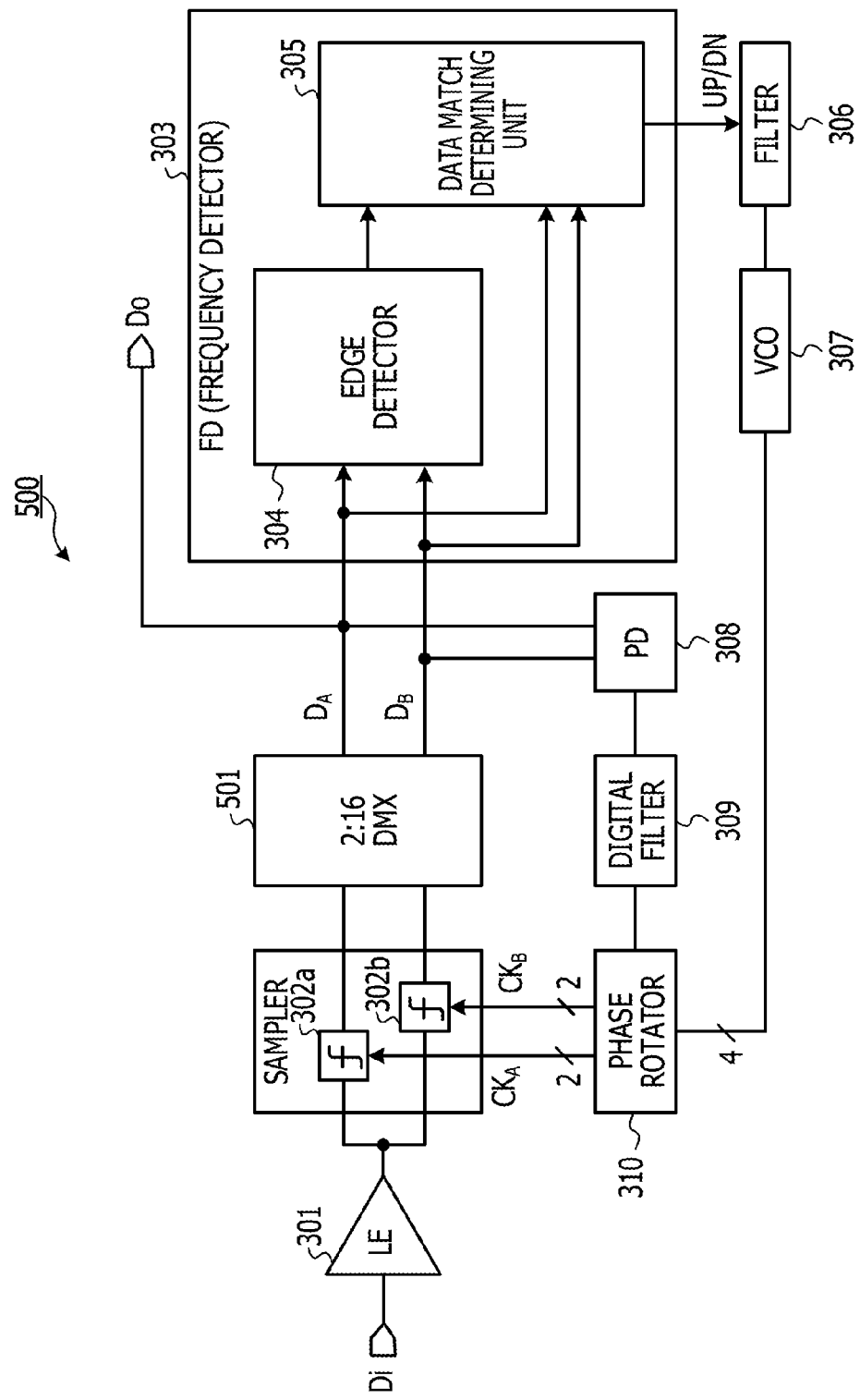
FIG. 8 is a diagram illustrating an example of another 2× oversampling CDR circuit.

FIG. 8 is a diagram illustrating an example of another 2× oversampling CDR circuit. In a receiving circuit 500 of FIG. 8, the same configuration as that of the receiving circuit 300 of FIG. 3 will be denoted by the same reference numeral as used for the receiving circuit 300 of FIG. 3. The receiving circuit 500 includes a demultiplexer 501 between the sampler 302 and the FD 303 of the receiving circuit 300.

The demultiplexer 501 extracts components of an input signal and outputs the components as individual signals. By measuring two points of the phases A and B, the internal clock frequency may be adjusted through the 2× oversampling CDR. By implementing the 2× oversampling CDR, compared to 4× oversampling, the number of comparators may be decreased, and the circuit scales of a clock buffer, a demultiplexer, and the like may be decreased. As a result, the amount of power consumption may also be reduced.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to an illustrating of the superiority and inferiority of the invention. Although the embodiments of the present invention have been described in detail, it should be understood that the various changes, substitutions, and alterations could be made hereto without departing from the spirit and scope of the invention.

What is claimed is:

1. A receiving circuit comprising:
a detector configured to detect a position at which logics of first data and second data acquired by sampling received data using two clocks having mutually-different phases do not match each other as an edge; and
an adjustment circuit configured to perform an adjustment causing an internal clock frequency to be close to a data frequency in the received data based on a first probability that logics of third data in a next cycle of the first data and the second data match each other and a second probability that logics of fourth data in a next cycle of the second data and the third data match each other.

2. The receiving circuit according to claim 1, wherein, when the first probability is higher than a specific value and the second probability is higher than the specific value, the adjustment circuit determines that the internal clock frequency is higher than the data frequency and performs an adjustment decreasing the internal clock frequency.

3. The receiving circuit according to claim 1, wherein, when the first probability is lower than a specific value, the adjustment circuit determines that the internal clock frequency is lower than the data frequency and performs an adjustment increasing the internal clock frequency.

4. The receiving circuit according to claim 1, further comprising:
a calculation circuit configured to update the first probability and the second probability for each received data.

5. A method for controlling a frequency comprising:
detecting a position at which logics of first data and second data acquired by sampling received data using two clocks having mutually-different phases do not match each other as an edge; and
performing an adjustment causing an internal clock frequency to be close to a data frequency in the received data based on a first probability that logics of third data in a next cycle of the first data and the second data match each other and a second probability that logics of fourth data in a next cycle of the second data and the third data match each other.

6. The method according to claim 5, further comprising:
determining that the internal clock frequency is higher than the data frequency when the first probability is higher than a specific value and the second probability is higher than the specific value; and
performing an adjustment decreasing the internal clock frequency.

7. The method according to claim 5, further comprising:
determining that the internal clock frequency is lower than the data frequency when the first probability is lower than a specific value; and
performing an adjustment increasing the internal clock frequency.

8. The method according to claim 5, further comprising:
updating the first probability and the second probability for each received data.

9. A receiving circuit comprising:
a phase rotator configured to output two clocks having mutually-different phases;
a sampler configured to acquire first data and second data by sampling received data using the two clock;
a detector configured to detect a position at which logics of the first data and the second data do not match each other as an edge; and
an adjustment circuit configured to perform an adjustment causing an internal clock frequency to be close to a data frequency in the received data based on a first probability that logics of third data in a next cycle of the first data and the second data match each other and a second probability that logics of fourth data in a next cycle of the second data and the third data match each other.

10. The receiving circuit according to claim 9, wherein, when the first probability is higher than a specific value and the second probability is higher than the specific value, the adjustment circuit determines that the internal clock frequency is higher than the data frequency and performs an adjustment decreasing the internal clock frequency.

11. The receiving circuit according to claim 9, wherein, when the first probability is lower than a specific value, the adjustment circuit determines that the internal clock frequency is lower than the data frequency and performs an adjustment increasing the internal clock frequency.

12. The receiving circuit according to claim 9, further comprising:
a calculation circuit configured to update the first probability and the second probability for each received data.

* * * * *